United States Patent
Roth et al.

(10) Patent No.: US 8,629,575 B2
(45) Date of Patent: Jan. 14, 2014

(54) INTEGRATED CIRCUIT AND METHOD FOR CHARGE REVERSAL OF A CIRCUIT PART OF THE INTEGRATED CIRCUIT

(75) Inventors: Harald Roth, Munich (DE); Helmut Schneider, Munich (DE)

(73) Assignee: Qimonda AG, Munich (DE)

( * ) Notice: Subject to any disclaimer, the term of this patent is extended or adjusted under 35 U.S.C. 154(b) by 1491 days.

(21) Appl. No.: 12/168,747

(22) Filed: Jul. 7, 2008

(65) Prior Publication Data

US 2009/0009003 A1 Jan. 8, 2009

(30) Foreign Application Priority Data

Jul. 5, 2007 (DE) .......................... 10 2007 031 411

(51) Int. Cl.
*H02J 1/00* (2006.01)
(52) U.S. Cl.
USPC ............................................ 307/75; 361/246
(58) Field of Classification Search
USPC ............ 361/245, 246, 230, 231, 267; 307/75, 307/28, 127, 138, 106–108, 110; 326/62–79; 365/230.06
See application file for complete search history.

(56) References Cited

U.S. PATENT DOCUMENTS

| | | | |
|---|---|---|---|
| 6,262,934 B1 * | 7/2001 | Uehara | 365/230.06 |
| 6,901,023 B2 * | 5/2005 | Kirsch et al. | 365/230.06 |
| 7,266,027 B2 | 9/2007 | Schneider et al. | |
| 2005/0276148 A1 * | 12/2005 | Fujima | 365/230.06 |
| 2009/0009003 A1 * | 1/2009 | Roth et al. | 307/75 |

FOREIGN PATENT DOCUMENTS

DE 102004047058 4/2006
JP 10241361 A * 9/1998

OTHER PUBLICATIONS

Machine Translation of JP10241361.*

* cited by examiner

*Primary Examiner* — Fritz M Fleming
(74) *Attorney, Agent, or Firm* — Patterson & Sheridan, LLP

(57) ABSTRACT

A description is given of a method for charge reversal of a circuit part of an integrated circuit from a first electrical potential to a second electrical potential of a first voltage network. In this case, the circuit part is connected to the first voltage network for charge reversal. Furthermore, the circuit part is connected to a second voltage network for charge reversal, said second voltage network providing a third electrical potential between the first and the second electrical potential. The circuit part is automatically isolated from the second voltage network before its electrical potential reaches the second electrical potential.

19 Claims, 10 Drawing Sheets

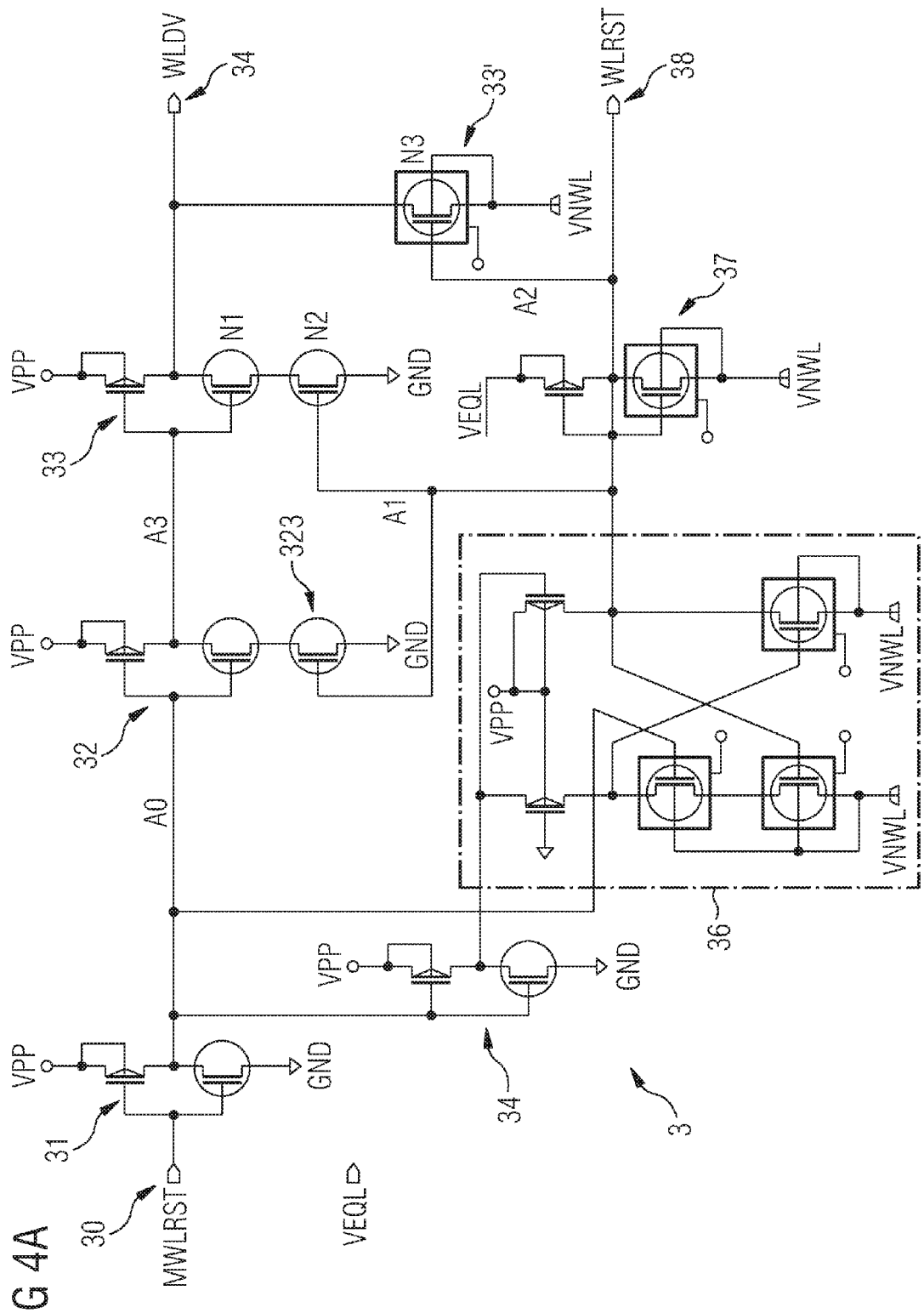

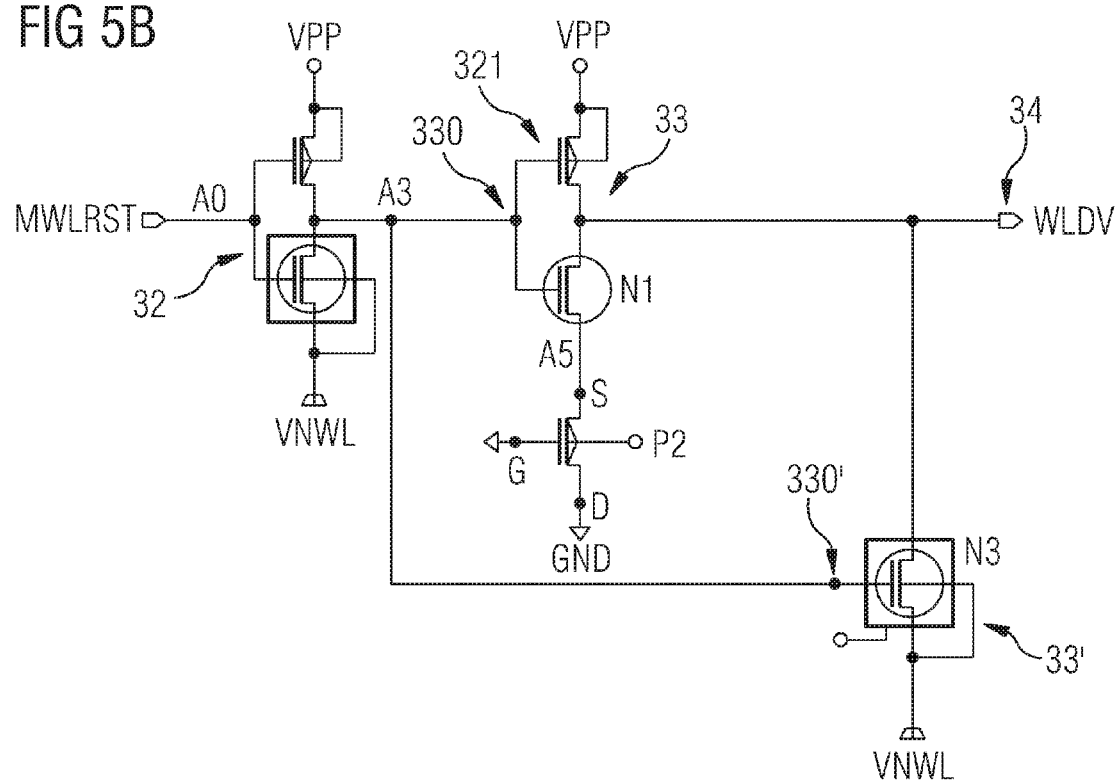
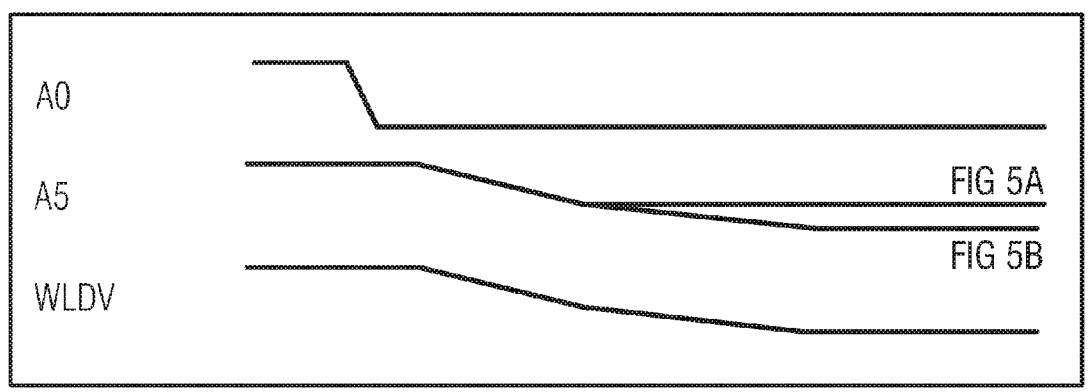

INTEGRATED CIRCUIT AND METHOD FOR CHARGE REVERSAL OF A CIRCUIT PART OF THE INTEGRATED CIRCUIT

CROSS-REFERENCE TO RELATED APPLICATIONS

This application claims foreign priority benefits under 35 U.S.C. §119 to co-pending German patent application number DE 10 2007 031 411.8-55, filed 5 Jul. 2007. This related patent application is herein incorporated by reference in its entirety.

BACKGROUND

Integrated circuits generally comprise a multiplicity of circuit parts, such as various components and electrical lines, for example, which are connected to one another in a manner predetermined by the respective application. During operation of the integrated circuit, a circuit part may frequently change between a plurality of operating states, which can be manifested by a specific electrical potential of the respective circuit part. When its operating state changes, the circuit part is then subjected to charge reversal from a first to a second electrical potential, that is to say that its present electrical potential is pulled to a higher or a lower voltage level. Since circuit parts represent a greater or lesser capacitive load depending on their construction and function within the integrated circuit, the charge reversal of a circuit part is always associated with a charge transport manifested by a charge-reversal current. Said charge-reversal current can be drawn from a voltage network that provides the desired electrical potential. The circuit part is then electrically conductively connected to the voltage network for charge reversal. The voltage network can be fed for example by a voltage source outside the electronic circuit. Generally, only a small number of discrete voltage levels are made available to the circuit part by such an external voltage supply of the integrated circuit. However, further voltage levels within the voltage range of the external voltage supply can be generated relatively easily. However, if voltage levels are required which lie above or below the voltage range made available by the external voltage supply, it is necessary to use special voltage converters, such as e.g. internal voltage charge pumps. While other DC-DC converters (e.g. step-up or boost converters) generate their voltages on the basis of a reference potential with the aid of inductances, voltage pumps generate the higher or lower electrical potential provided with the aid of capacitances. Since voltage pumps can also be arranged in multistage fashion, they are particularly well suited to raising or lowering the discrete voltage levels made available by the external voltage supply within an extended voltage range in accordance with the respective application. In contrast to an external voltage supply, however, the maximum output current of a voltage pump is greatly limited by the magnitude of the capacitances and the frequency. Therefore, voltage pumps are used primarily if large output currents are not required. Furthermore, this type of voltage conversion is associated with a higher energy expenditure, for which reason drawing the charge reversal current from a pumped voltage network puts an additional burden on the total current consumption of the integrated circuit, where the additional burden depends on the magnitude of the desired voltage value and the pump stages required for this desired voltage value and also the efficiency thereof. This holds true especially during the charge reversal of large capacitances. Particularly in "low" power applications, that is to say applications having a reduced current consumption, however, the total current consumption of an electronic circuit represents a critical variable.

A concrete embodiment of this problem can be observed inter alia in integrated memory circuits, such as e.g. in a dynamic random access memory (DRAM), in which word lines are pulled from a high active voltage to a low blocking voltage level below the negative supply voltage with the aid of special driver circuits for the purpose of addressing specific memory areas. In this case, the blocking voltage level has to be generated by means of special pump stages, which put a relatively great burden on the total current consumption of the integrated circuit.

In order to reduce the total current consumption, therefore, integrated circuits are often designed in such a way that primarily circuit parts which require a relatively large charge-reversal current on account of their capacitance are operated as far as possible within the voltage range made available by the external voltage supply. However, such restrictions are often also associated with effects, such as e.g. higher leakage currents, which can affect the functionality of the entire integrated circuit.

SUMMARY

The embodiments described in the following relate to a method for charge reversal of a circuit part of an integrated circuit and to an integrated circuit configured for such charge reversal.

One embodiment includes a method for charge reversal of a circuit part of an integrated circuit from a first to a second electrical potential, the method comprising:

connecting the circuit part to a first voltage network, which provides the second electrical potential, connecting the circuit part to a second voltage network, which provides a third electrical potential between the first and the second electrical potential, and automatically isolating the circuit part from the second voltage network before the second electrical potential is reached.

Another embodiment includes an integrated circuit comprising a circuit part having a first operating state, which is determined by a first electrical potential, and a second operating state, which is determined by a second electrical potential, wherein the circuit part can be subjected to charge reversal between the first and the second electrical potential. The integrated circuit further comprising a first voltage network, which provides the second electrical potential, a second voltage network, which provides a third electrical potential between the first and the second electrical potential and a driver device, which brings about a charge reversal of the circuit part from the first to the second electrical potential. The driver device comprising a first switching device, which is arranged between the circuit part and the first voltage network and via which the circuit part can be connected to the first voltage network for the purpose of charge reversal. The driver device further comprising a second switching device, which is arranged between the circuit part and the second voltage network and which via the circuit part can be connected to the second voltage network for the purpose of charge reversal. The driver device being configured to automatically isolate the circuit part from the second voltage network before the second electrical potential is reached.

BRIEF DESCRIPTION OF THE DRAWINGS

FIG. 4A shows another embodiment of a superordinate driver circuit in which the isolation of the circuit part from the second voltage network is effected in time-delayed fashion;

FIG. 5B shows another embodiment of a superordinate driver circuit in which the isolation of the circuit part from the second voltage network is effected in self-regulating fashion;

FIG. 5C shows a diagram for illustrating the temporal development of the signals of the superordinate driver circuit of FIGS. 5A and 5B;

DETAILED DESCRIPTION

Figure 1A:
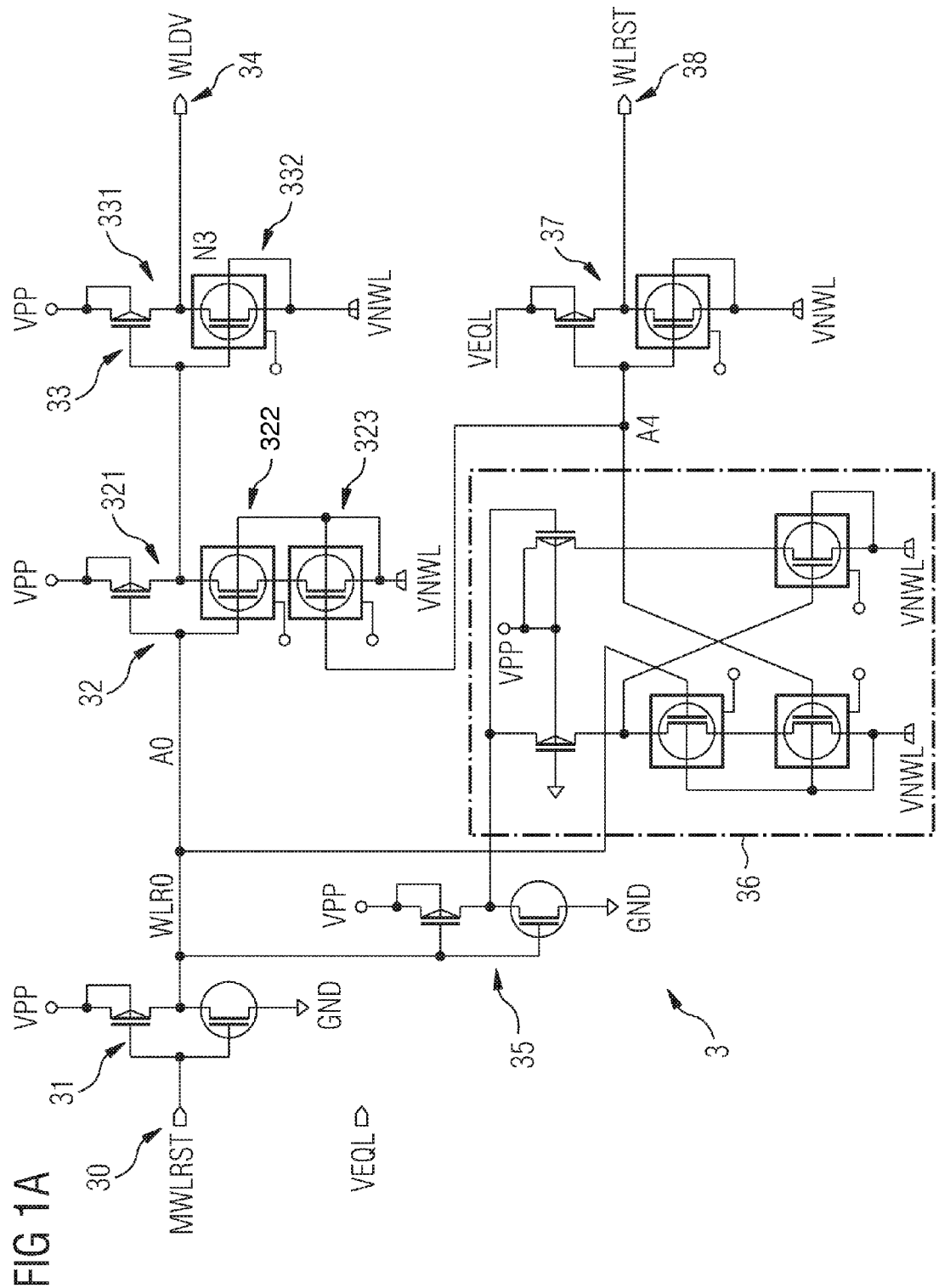
FIG. 1A shows one embodiment of a superordinate driver circuit for charge reversal of word lines of an integrated memory circuit from a first to a second electrical potential.

In the following a method for operating an integrated circuit, in particular a memory circuit, such as e.g. a DRAM is disclosed, wherein a part of the integrated circuit, such as e.g. a word line, is pulled to a specific electrical potential provided by a pumped voltage network. In this case, the charge reversal of the circuit part is effected both via the pumped voltage network and via an external voltage network decoupled from the pumped voltage network.

In one embodiment, a method makes it possible to provide an integrated circuit in which the charge reversal of a circuit part puts the least possible burden on the total current consumption of the circuit.

The method for charge reversal of a circuit part of an integrated circuit from a first electrical potential to a second electrical potential, which is provided by a first voltage network, provides for connecting the circuit part to the first voltage network for charge reversal. Furthermore, the circuit part is connected to a second voltage network for charge reversal, said second voltage network providing a third electrical potential between the first and the second electrical potential. The circuit part is automatically isolated again from the second voltage network before its electrical potential reaches the second electrical potential. The loading of the first voltage network during charge reversal of the circuit part can be reduced as a result of the connection of the second voltage network. Particularly when the generation of the electrical potential of the first voltage network within the integrated circuit takes place in relatively current-intensive fashion, a reduction of the total current consumption of the integrated circuit can be achieved as a result of the connection to the second voltage network. Since the disconnection of the second voltage network takes place automatically, no control signal fed to the driver circuit externally is necessary for this. As a result, the circuitry outlay can be considerably reduced.

In one embodiment the circuit part is first connected only to the second voltage network, and the circuit part is isolated from the second voltage network before being connected to the first voltage network. Since the first voltage network is connected only when the second voltage network has already been disconnected, no shunt current can flow between the voltage networks. This may permit better mutual decoupling of the two voltage networks.

In a further embodiment, the circuit part is first connected only to the second voltage network. Afterward, the circuit part is also connected to the first voltage network before yet being isolated from the second voltage network. A relatively faster charge reversal of the circuit part may be possible as a result of the overlap of the connection phases of the two voltage networks. A shunt current that possibly arises between the two voltage networks may also be prevented by structural measures, according to one embodiment.

A further embodiment provides for the circuit part to be simultaneously connected both to the first and to the second voltage network. This enables even faster discharging since the charge-reversal current can be drawn from both voltage networks during the entire initial phase of the charge-reversal operation until the disconnection of the second voltage network. A shunt current between the two voltage networks is not expected precisely in the initial phase since the circuit part has a significant potential difference with respect to both networks.

In a further embodiment, the circuit part is connected to the second voltage network via a switching transistor. In this case, the automatic isolation of the circuit part from the second voltage network is effected by a specific potential difference between two terminals of the switching transistor being undershot or exceeded due to the change in the electrical potential during charge reversal of the circuit part. In particular, the switching transistor can automatically isolate the circuit part from the first voltage network as soon as the potential difference between a control terminal of the switching transistor and a current terminal of the switching transistor, said current terminal being connected to the circuit part, undershoots a threshold voltage of the switching transistor due to the change in the electrical potential of the circuit part, said threshold voltage forming the switching threshold between a conducting and a non-conducting operating state of the switching transistor. Particularly simple and reliable charge reversal of the circuit part can be realized by this means. In this case, a shunt current may automatically be prevented if the second voltage network is disconnected at a point in time at which the first voltage network has not yet been connected. A corresponding circuit can manage with a significantly smaller layout area since no additional circuits are required.

A further embodiment provides for the isolation of the circuit part from the second voltage network to be effected via a first switching transistor as soon as a first control signal is present at the control input of the first switching transistor. Furthermore, the connection of the circuit part to the first voltage network is effected via a second switching transistor as soon as a second control signal, which is delayed relative to the first control signal, is present at a control input of the second switching transistor. In this case, a suitable signal of the integrated circuit serves as the second control signal. Through different delaying of the second control signal, the temporal overlap region of the connection phases of the two voltage networks and thus also that proportion of the charge-reversal current which is drawn via the pumped or the non-pumped voltage network can be varied as desired. A correspondingly long delay permits the temporal decoupling of the two connection phases, thereby preventing a shunt current between the two voltage networks.

In a further embodiment it is provided that the second control signal is derived by delaying the first control signal. Since this can be realized either by using signals which are already present within the integrated circuit and which have been derived from the first control signal, or by a simple delay of the first signal, no external control signal is necessary. Therefore, the integrated circuit can be formed in correspondingly simpler fashion.

A further embodiment provides, inter alia, for the second electrical potential of the first voltage network to be generated by a charge pump generator of the integrated circuit, while the third electrical potential of the second voltage network is provided by an external voltage supply of the integrated circuit. Precisely this combination permits good current saving since the loading of the relatively energy-intensive pumped voltage network can be relieved by means of the external voltage network.

Particular embodiments of charge reversal methods are described in more detail below only on the basis of a specific application, namely an integrated memory circuit. However, the concepts presented here can be applied, in principle, to all integrated circuits in which circuit parts are subjected to charge reversal from a first to a second electrical potential.

Integrated memory circuits, such as e.g. a dynamic random access memory (DRAM), generally have a multiplicity of memory cells organized in matrix-type arrangements, the so-called memory cell arrays. Word and bit lines serving for the addressing of the memory cells run through each memory cell array, wherein the individual memory cells are arranged in each case at a crossover point between a word line and a bit line. Each memory cell within the memory cell array can be uniquely addressed by selection or activation of a specific word line and bit line. In a DRAM memory, in which each memory cell can store individual data bits in the form of charges in a storage capacitor, the active word line controls a selection transistor assigned to the respective memory cell, which transistor produces an electrically conductive connection between the storage capacitor of the memory cell and the associated bit line. The selected bit line is connected to special amplifier circuits that are in turn connected to data lines leading out of the cell array. This makes it possible to write data to the selected memory cell or read out data from the memory cell via a bit line.

In this case, a word line WL is generally activated by charge reversal, wherein the electrical potential of said line is pulled from a first voltage level $V_{NWL}$, which corresponds to the inactive operating state of the word line, to a second voltage level $V_{PP}$, which corresponds to an active operating state of the word line. A driver device 2 (FIG. 8) is generally used for charge reversal of the word line WL. In this case, the driver device 2 comprises a superordinate driver circuit 3 (FIG. 1A), which generates a word line restore signal (WLRST) and a word line activation signal (WLDV) that supplies the required voltage swing, and the local word line driver 4 (FIG. 2A), which, as a subordinate driver circuit, switches through the voltages $V_{PP}$, $V_{NWL}$ provided with the word line activation signal by the superordinate driver circuit 3 onto the word line WL assigned to said driver. Whereas, therefore, a superordinate driver circuit 3 of an integrated memory circuit determines, by providing the corresponding voltage $V_{PP}$, whether the word lines WL connected to it in each case via a dedicated local word line driver 4 can be activated, the subordinate driver circuits 4 determine which word lines WL are actually activated.

A superordinate driver circuit 3 is illustrated by way of example in FIG. 1A. This circuit has a signal input 30 for receiving a control signal MWLRST from a superordinate addressing device (not shown here), and two signal outputs 34 and 38, to which a plurality of local word line drivers 4 may be connected. A first inverter 31 is arranged in the input region of the superordinate driver circuit 3, which first inverter inverts the input signal MWLRST. Its output signal WRL0 is present at the node A0, from which two signal paths branch off. The upper one of the two signal paths comprises two series-connected inverters 32, 33, with the aid of which a word line activation signal WLDV is generated. The second inverter 32, which is connected to the first node A0 by its control input, has a p-type field effect transistor 321 and two series-connected n-type field effect transistors 322, 323. In this case, the control electrode of the second n-FET 323 is connected to a node A4 from the lower signal path. The p-type field effect transistor 331 of the third inverter 33, which is connected downstream of the second inverter 32, is connected to the VPP voltage network, while the associated n-type field effect transistor 332 is connected to the VNWL voltage network. Consequently, the output signal WLDV on the first signal output 34 of the superordinate driver circuit 3 changes between the first and the second electrical potential $V_{PP}$, $V_{NWL}$ depending on the input signal MWLRST. Although the first signal output 34 of the superordinate driver circuit 3 is typically connected to a plurality of local word line drivers 4, such that the output signal WLDV of the third inverter 33 simultaneously activates all the affected word lines WL, the output signal WLDV is actually switched through only to a very specific selection of the word lines WL. The superordinate driver circuit 3 shown in FIG. 1A in this case draws the charge-reversal current for the deactivation of the selected word lines WL completely from the pumped VNWL voltage network.

The lower one of the two signal paths branching off from the node A0 generates the word line restore signal WLRST, which serves for disconnecting the active word line WL in the local word line driver 4. This signal path comprises a level shifter 36 and a downstream driver stage 37 for generating the word line restore signal WLRST. While a first signal input of the level shifter 36 is connected directly to the node A0, an inverter 35 is interposed between a second signal input of the level shifter 36 and the node A0. The level shifter 36 serves for matching the signal level of the signals involved. In the present case, the level shifter 36 converts the lower voltage level of the fourth inverter 35 from the negative supply voltage (ground potential) GND to the negative blocking voltage level $V_{NWL}$ generated by a voltage pump. This improves the blocking behavior of the n-type field effect transistor of the downstream driver stage 37. The output signal of the level shifter 36, said output signal being present at the node A4, serves as a control signal for the n-FET 323 of the second inverter stage 32. For this purpose, the gate terminal of the n-FET 323 is connected to the node A4. The driver stage 37 is formed as an inverter whose p-type field effect transistor is connected to a VEQL voltage network, while the associated n-type field effect transistor is connected to the VNWL voltage network. The positive electrical potential $V_{EQL}$ lies between the $V_{PP}$ potential and the ground potential GND.

Figure 1B:
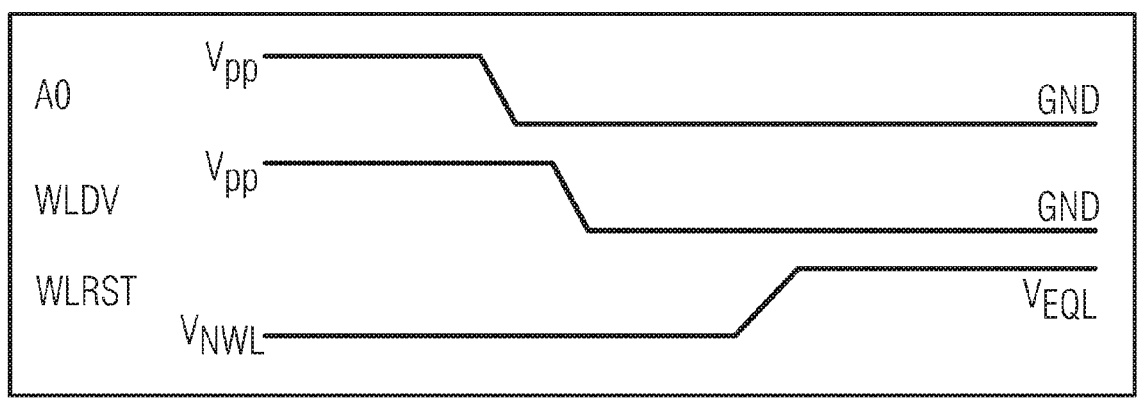
FIG. 1B shows a diagram for illustrating the temporal development of the signals with the superordinate driver circuit of FIG. 1A.

FIG. 1B shows the schematic profile of the signals of the driver circuit 3 from FIG. 1A during the deactivation operation of the selected word line WL. If the input signal changes from a low to a high voltage level, the signal WLR0 at the node A0 falls in slightly delayed fashion from the active voltage $V_{PP}$ to the ground potential GND. After a delay by the second and third inverter 32, 33, the output signal WLDV of the first signal path also falls from the active voltage $V_{PP}$ to the blocking voltage level $V_{NWL}$. Finally, after a longer delay by the level shifter 36, the output signal WLRST of the second signal path also changes from the negative blocking voltage level $V_{NWL}$ to the positive voltage level $V_{EQL}$, which corresponds for example to the positive supply voltage $V_{EXT}$.

Figure 2A:
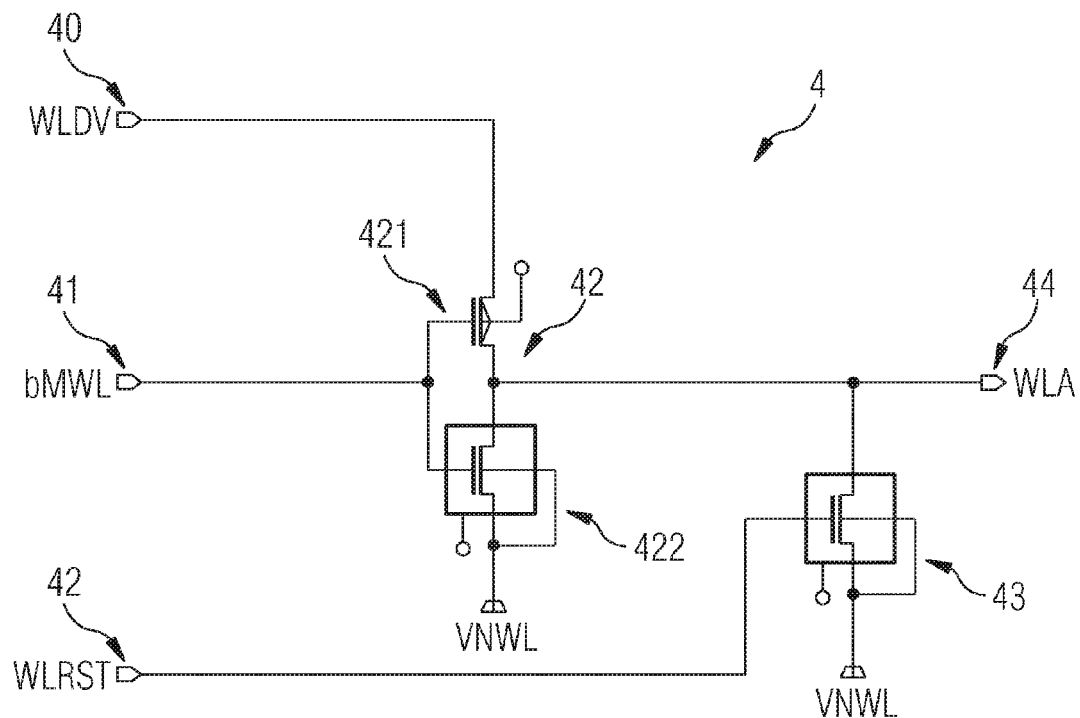
FIG. 2A shows one embodiment of a local driver circuit assigned to an individual word line of the memory device.

In order to reduce the circuitry outlay, typically 64 or 128 local word line drivers are connected to a superordinate driver circuit 3. FIG. 2A shows one of said local word line drivers 4. This circuit has three signal inputs 40, 41 and 42 and a signal output 44, to which the associated word line WL is connected. The signal WLDV of the superordinate driver circuit 3, said signal being present at the first signal input 40, is switched to the signal output 44 via a p-type field effect transistor (p-type enable transistor of the master word line) 421 of an inverter stage 42 if a "low" potential is present at the second signal input 41 of the local word line driver 4. By contrast, the n-type field effect transistor 422 of the inverter 42 switches the negative blocking voltage level $V_{NWL}$ to the signal output 44 if a "high" potential is present at the second signal input 41 of the local word line driver 4. In this case, the inverted master word line signal bMWL provided by a superordinate addressing device (not illustrated here) serves as the control signal of the inverter 42. A further switching transistor 43 further switches the negative blocking voltage level $V_{NWL}$ to the signal output 44 of the local word line driver 4. The switching transistor 43, here formed as an n-type field effect transistor, is controlled with the aid of the word line restore signal WLRST received from the superordinate driver circuit 3 via the third signal input 42. Said control signal WLRST brings about a disconnection of the active word line WL.

Figure 2B:
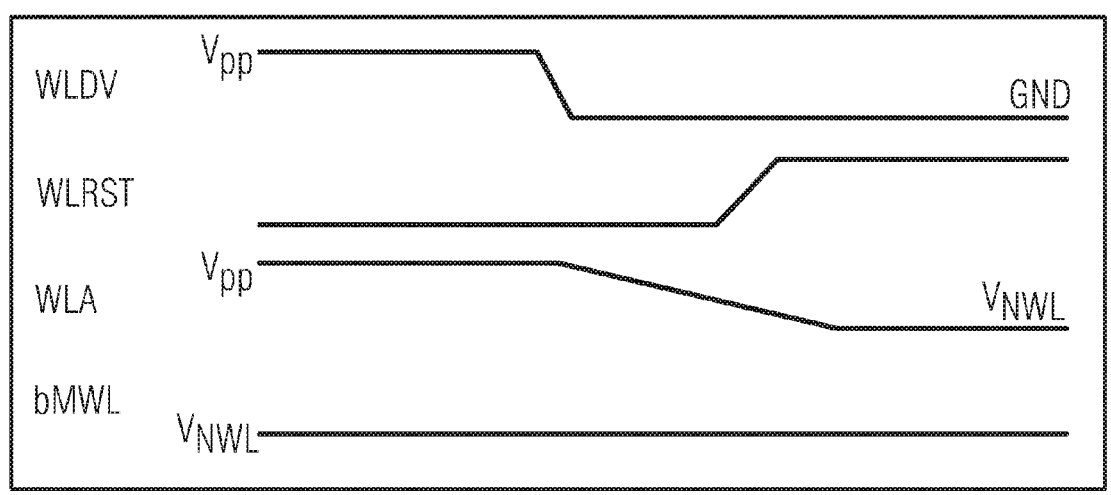
FIG. 2B shows a diagram for illustrating the temporal development of the signals of the local driver circuit of FIG. 2A.

FIG. 2B shows a typical profile of the signals of the local word line driver 4 from FIG. 2A. It becomes clear here that the change in the control signal WLDV present at the first control input 40 of the word line driver 4 has the effect that the signal WLA of the word line WL is pulled gradually from the active voltage $V_{PP}$ to the blocking voltage level $V_{NWL}$ below GND if the inverted master word line signal bMWL has the blocking voltage level $V_{NWL}$. In this case, the charge reversal of the word line WL is effected exclusively via the VNWL voltage network, the negative blocking voltage level $V_{NWL}$ of which is generated by a voltage pump.

In order to prevent a pumped voltage network from being loaded during charge reversal of the word line WL, the lower voltage level of the WLDV signal can be restricted to the ground potential GND. This may have the disadvantage, however, that, in the case of an active master word line (inverted master word line signal bMWL at the blocking voltage level $V_{NWL}$) and a non-active local word line WL (WLDV signal at the ground potential GND), the gate-source voltage of the p-type enable transistor 421 of the master word line in the local word line driver 4 is less than zero. As a result of this, the p-type enable transistor 421 is not fully closed during this phase and a leakage current flows between the voltage network VNWL of the local word line WL and ground GND.

A plurality of exemplary embodiments are presented below which make it possible to relieve the loading of the pumped voltage network VNWL without in the process causing a leakage current between the pumped voltage network VNWL and ground GND. Instead of drawing the entire charge-reversal current of a load capacitance, such as the word line WL, from a pumped voltage network, part of the charge-reversal current is drawn from a non-pumped voltage network, such as e.g. the ground voltage network GND. In order to prevent a leakage current from flowing between the two voltage networks VNWL and GND in the process, they are decoupled from one another. This is achieved by virtue of the fact that the voltage networks are connected to the local word line WL independently of one another and partly in time-offset fashion. In this case, the connection and disconnection of the two voltage networks VNWL, GND and thus also their mutual decoupling take place automatically, that is to say without corresponding control signals additionally having to be fed externally to the driver circuits 3, 4. This can be achieved either in self-regulating fashion or with the aid of internal signals which are present anyway within the two driver devices 3, 4, and can be utilized as control signals. The decoupling can be ensured in two possible ways, in principle: firstly by temporally offset connection and disconnection of the networks by means of internal signals and secondly by self-regulating decoupling of the non-pumped voltage network GND.

In a first embodiment, the decoupling of the two voltage networks is achieved by temporally offset connection and disconnection of the networks, wherein for example signals that are already present are utilized as control signals for the connection and disconnection of the networks.

Figure 3A:
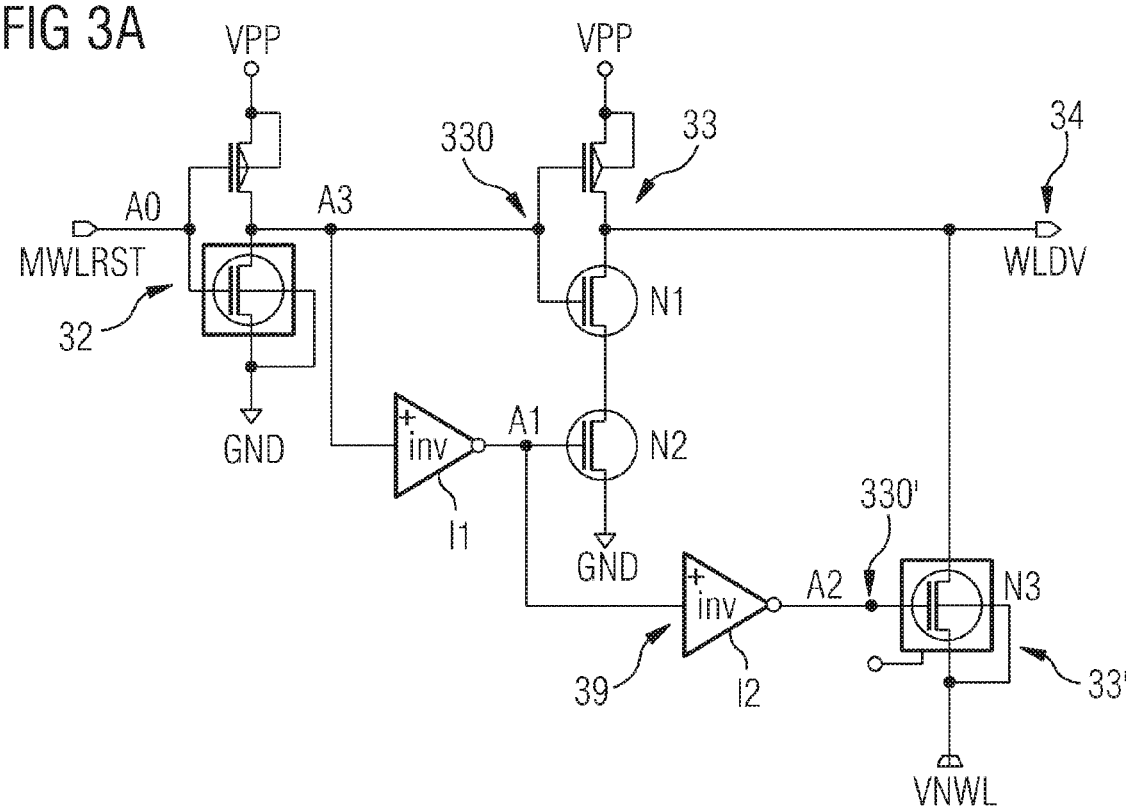
FIG. 3A shows one embodiment of a superordinate driver circuit, in which the isolation of the circuit part from the second voltage network is effected in time-delayed fashion.

FIG. 3A shows the upper signal path of a modified superordinate driver circuit 3, according to one embodiment. In this case, the transistor N3 connected to the VNWL voltage network within the third inverter stage 33 was replaced by two series-connected n-type field effect transistors N1, N2, wherein the second transistor N2 is now connected to ground GND. The additional second transistor N2 is controlled by an output signal of an inverter I1, which is connected to the node A3 by its input. A further n-type field effect transistor N3, which is connected to the pumped voltage network VNWL and corresponds to the original transistor N3 from FIG. 1A, is likewise connected to the first signal output 34 of the superordinate driver circuit 3. What is used as the control signal of the transistor N3 is the output signal of a second inverter I2, the input of which is connected to the output of the first inverter I1 at the node A1.

A critical phase for the loading of the pumped voltage network VNWL is the transition from 1 (high) to 0 (low) at the node A0 of the superordinate driver circuit 3, since WLDV is subjected to charge reversal from the $V_{PP}$ potential to the $V_{NWL}$ potential as a result of this. In this case, the n-type transistor N1 of the third inverter stage 33 is opened by the $V_{PP}$ potential present at the node A3. The transistor N2 is likewise open as long as the signal of the node A3, on account of a delay by inverter I1, has not yet propagated as far as the node A1 and the node A1 is therefore still at the "high" potential from a preceding switching operation. Consequently, the first signal output 34 is connected to ground GND. By contrast, the transistor N3, via which the VNWL voltage network is connected to the output 34, is switched off since the node A2 is still at the "low" potential on the preceding switching operation. In this first phase of the charge-reversal operation, the word line WL is therefore discharged exclusively via ground GND. As soon as the signal of the node A3 has propagated to the node A1 through the inverter I1, the node A1 is thus at its "low" potential, the transistor N2 turns off. As a result of this, the current path to the ground network GND is interrupted. Only when the signal has propagated through the second inverter I2, that is to say a "high" potential is present at the node A2, does the transistor N3 supplementarily connect the pumped voltage network VNWL. The word line WL is then discharged exclusively via the pumped voltage network VNWL. The two delay stages I1 and I2 may be formed by inverters within the word line driver 2. However, it is also possible to use inverters or inverter chains, or other components or circuit parts of the integrated circuit 1 which bring about a suitable delay of the signals. If appropriate, an adaptation of the driver circuit 3, such as e.g. the replacement of the n-type switching transistors N1, N2, N3 by correspondingly complementarily doped switching elements, is then necessary in order to obtain the desired switching behavior.

A complete temporal decoupling of the connection phases of the two voltage networks GND and VNWL is possible by providing a correspondingly long delay of the second delay stage I2. This prevents a shunt current between the two voltage networks. However, the delay of the second inverter stage I2 can also turn out to be significantly smaller and even be reduced down to zero. In the latter case, the inverter I2 between the nodes A1 and A2 can also be completely dispensed with, in which case the transistor N3 would have to be replaced by a p-type field effect transistor in order to achieve the same logical switching behavior. A particularly space-saving variant of the circuit is made possible as a result of this.

A shorter delay time of the second delay stage I2 accelerates the discharge of the connected word line WL. However, a small shunt current may then possibly flow between the two voltage networks if the disconnection of ground GND and the simultaneous connection of the VNWL voltage network last for a certain period of time, such that the two operations overlap.

Figure 3B:
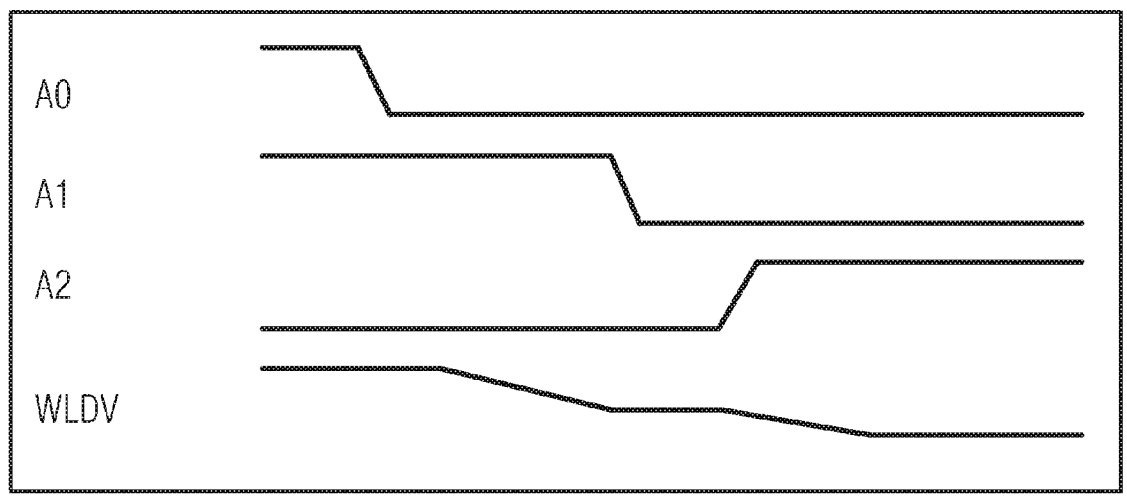
FIG. 3B shows a diagram for illustrating the temporal development of the signals of the superordinate driver circuit of FIG. 3A.

FIG. 3B schematically shows the profile of the signals of the superordinate circuit 4 from FIG. 3A. It becomes evident in this case that the transistor N1 opens a short time after the signal at the node A0 has fallen from "high" to "low" due to the change in the signal level at the node A3 from "low" to "high" and thus produces a current path between ground GND and the first signal output 34 of the superordinate driver circuit 3. A charge-reversal current then flows from the connected word line WL to ground GND, whereby the signal output 34 is gradually pulled from the active voltage $V_{PP}$ to a medium voltage level. The charge-reversal operation via ground GND ends as soon as the signal edge arrives at the node A1 after passing through the first delay stage I1, since only then does the transistor N2 turn off. Until the signal has propagated to the node A2 through the second delay stage I2, the first signal output 34 of the superordinate driver circuit 3 is connected neither to ground GND nor to the voltage network VNWL. Therefore, the output signal WLDV exhibits a plateau. As soon as a "high" potential is present at the node A2, the transistor N3 opens a current path between the VNWL voltage network and the first signal output 34. The VNWL voltage network finally pulls the first signal output 34 and thus also the word line WL connected thereto to the blocking voltage level $V_{NWL}$.

In principle, the control signals for the two transistors N2 and N3 can also be derived from signals of other circuit parts as long as their logic states, their voltage levels and their temporal offset (timing) essentially correspond to the signals represented above. This will be demonstrated below using the example of the lower signal path for generating the pull-down signal for the local word line driver 4. FIG. 4A shows a modified superordinate driver circuit, in which the output signal of the level shifter 36, said output signal being present at the node A1, is used as control signal for the transistor N2.

For this purpose, the control input of the transistor N2, in the same way as already the control input of the transistor 323 as well, is connected to the output of the level shifter 36. In this case, the node A1 is identical to the node A4 from FIG. 1A. Since the output signal of the level shifter 36 has the same logic state and the same voltage levels as and a comparable temporal delay to, the output signal of the first delay stage I1 from FIG. 3A, the use of the level shifter 36 does not require any further adaptation of the circuit. In the present exemplary embodiment, the output signal of the inverter 37 is used as the control signal for the transistor N3. For this purpose, the control input of the transistor N3 is connected to the output of the inverter 37. On account of the relatively high load present at the signal output 38, the inverter stage 37 pulls the electrical potential of the node A2 relatively slowly to the respective voltage level ($V_{EQL}$ or $V_{NWL}$). Consequently, the edge of the WLRST signal turns out to be relatively flat. This leads to a relatively effective delay since the transistor N3 opens more slowly and in delayed fashion. This in turn results in a good decoupling of the two voltage networks GND and VNWL.

Since the output signal of the inverter 37 has the required logic state, a sufficient temporal offset relative to the signal at the node A1 and also a sufficiently large voltage swing, no further adaptation of the driver circuit 3 is necessary here either. The slightly reduced "high" potential $V_{EQL}$ of the inverter 37 by comparison with the $V_{PP}$ potential can be compensated for, if appropriate, by a stronger transistor N3.

Figure 4B:
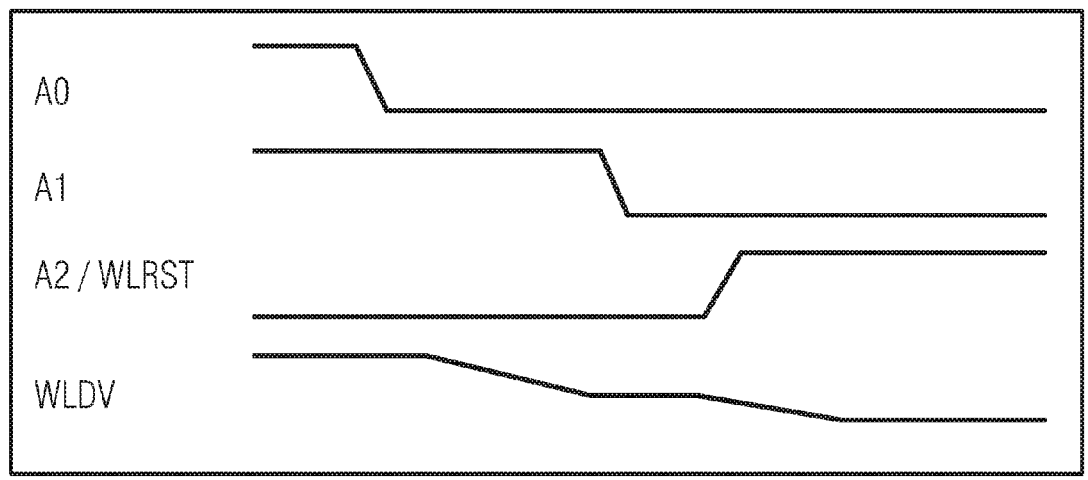
FIG. 4B shows a diagram for illustrating the temporal development of the signals of the superordinate driver circuit of FIG. 4A.

FIG. 4B schematically shows the profile of the signals of the superordinate driver circuit 4 from FIG. 4A. In this case, the level shifter 36 and the inverter stage 34 connected upstream act analogously to the first delay stage I1 and the second inverter stage 32 in FIG. 3A. By contrast, the driver stage 37 acts analogously to the second delay stage I2. Therefore, the profile of the signals in FIG. 4B essentially corresponds to the signal behavior shown in FIG. 3B.

The driver circuits 3 shown by way of example in FIGS. 3A and 4A enable the two voltage networks GND and VNWL to be fully decoupled since a sufficiently long delay between the disconnection of ground GND and the connection of the pumped voltage network VNWL can be achieved by means of the second delay stage I2 and by means of the inverter stage 37. However, it may also be desirable to connect the two voltage networks at least partly at the same time in order to accelerate the charge-reversal operation of the word line WL. In this case, another signal, such as e.g. the signal of the node A0 or the output signal of the inverter stage 35 connected upstream of the level shifter 36, can be used as the control signal for the transistor N3. Differentiated temporal overlaps of the connection phases of the two voltage networks GND and VNWL can be realized by additionally delaying said signals. Signals of adjacent circuits or circuit parts can also be used as control signals for the two transistors N2 and N3 if the abovementioned preconditions, such as, for example, the required logic state or the timing of the corresponding signals, are met.

The shunt current that possibly occurs between the pumped voltage network VNWL and ground GND in the event of a temporal overlap of the connection phases of the two voltage networks GND and VNWL can also be prevented by providing corresponding components, such as a blocking diode, for example, in the current path of one of the voltage networks.

The concept of the temporal decoupling of the connection phases of the two voltage networks GND and VNWL that is presented in FIGS. 3A and 4A for example uses signals that are already present within the circuit for the control of the connection and disconnection of the voltage networks. Therefore, the realization of this concept is dependent on the availability of suitable signals. In order to be independent of the development of other signals or in order to avoid the undefined state of the WLDV signal between the turning off of the transistor N2 and the delayed switching on of the transistor N3, the current path to ground GND can also be formed in self-regulating fashion. In this case, the disconnection of ground GND takes place automatically without necessitating a special control signal for the transistor N2.

Figure 5A:
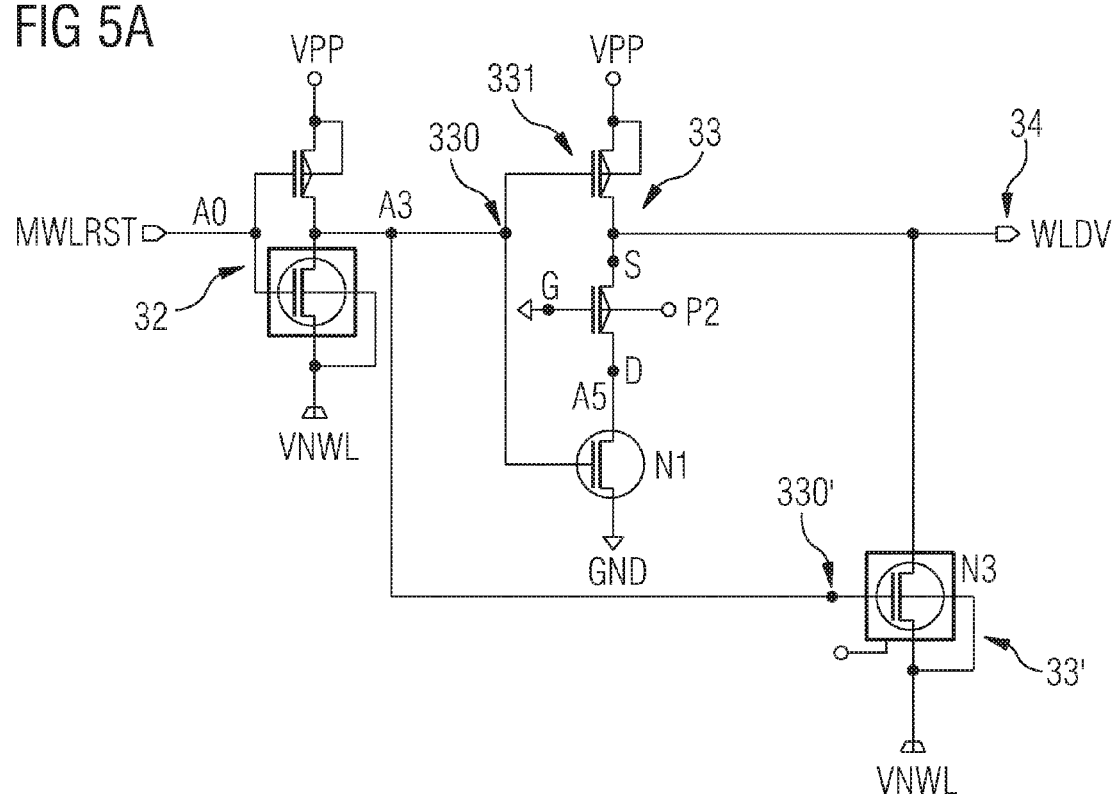
FIG. 5A shows one embodiment of a superordinate driver circuit in which the isolation of the circuit part from the second voltage network is effected in self-regulating fashion.

FIG. 5A shows one embodiment of a modified upper signal path of the superordinate driver circuit 3 (FIG. 1A), in which the disconnection of the GND voltage network takes place in self-regulating fashion. In this case, the third inverter stage 33 of the upper signal path has, alongside the p-FET 331 connected to the $V_{PP}$ voltage network, two series-connected transistors P2, N1, which form the current path to ground GND. The transistor N1 connected directly to ground is formed as an n-type field effect transistor, the control input 330 of which is connected to the node A3. By contrast, the transistor P2 is formed as a p-type field effect transistor, the control terminal of which is connected to the ground potential GND. In this case, the connection of the pumped voltage network VNWL is effected analogously to the exemplary embodiments already shown in FIGS. 3A and 4A by means of a separate n-type field effect transistor N3 arranged between the pumped voltage network VNWL and the signal output 34. The output signal of the second inverter stage 32 serves as the control signal for the transistor N3. For this purpose, its control terminal is connected to the node A3.

At the beginning of the charge-reversal operation, if the signal of the node A3 changes from the "low" potential $V_{NWL}$ to the "high" potential $V_{PP}$, both transistor N2 and transistor N3 are opened. Since the control terminal of the transistor P2 is held permanently at ground GND and its source terminal is at the positive $V_{PP}$ potential at the beginning, the transistor P2 is also initially in the on state. Consequently, the word line WL is initially discharged both by a ground GND and via the pumped voltage network VNWL. The transistor P2 remains open until the electrical potential $V_S$ at the source terminal of the transistor P2 has reached a specific electrical potential, due to the discharging of the word line WL, which potential is higher than the potential $V_G$ of its gate terminal by the threshold voltage $V_t$ of the transistor P2. As soon as the gate-source voltage $V_{GS}$, that is to say the difference between the source potential and the gate potential ($V_S-V_G$), undershoots the threshold voltage $V_t$ of the transistor P2 ($V_{GS}<V_t$), the transistor P2 turns off automatically. Consequently, the following can be derived as a disconnection condition for the ground network GND:

$$V_{GS}=V_S-V_G<V_t$$
$$\Rightarrow V_S<V_G+V_t=\text{GND}+V_t$$
$$\Rightarrow V_S<\text{GND}+V_t$$

It is evident from this that the transistor P2 already isolates the word line WL from the non-pumped voltage network GND when the electrical potential at the first signal output 34 has not yet reached the ground potential GND. The further discharging of WLDV and thus also of the word line WL then takes place exclusively through the pumped voltage network VNWL. A shunt current from the pumped voltage network VNWL to ground GND is automatically prevented by virtue of the fact that the transistor P2 turns off shortly before the critical phase is reached. This is because as long as the potential of the first signal output 34 is more positive than the ground potential GND, electrons flow from the pumped voltage network VNWL exclusively to the word line WL to be discharged and not to ground GND. Only if the potential at the first signal output 34 falls below the ground potential GND and the transistor P2 were still open could a shunt current flow between the two voltage networks GND, VNWL. However, as described above, P2 is closed in the case of these potential conditions.

An alternative variant of the circuit in FIG. 5A is shown in FIG. 5B. In this case, the two transistors N1 and P2 were interchanged. Since a small voltage drop $V_{N1}$ already takes place through the channel resistance across the controlled transistor N1, the node A5 and therefore also the source terminal S of the transistor P2 are at a voltage level $V_S$ reduced by $V_{N1}$ in comparison with the voltage level of the first signal output 34. Consequently, the transistor P2 already turns off when the following condition holds true for the voltage level $V_S$ at the node A5:

$$V_S<\text{GND}+V_t+V_{N1}$$

Since the alternative circuit in FIG. 5B therefore turns off somewhat earlier than the variant shown in FIG. 5A, the relief of the loading of the pumped voltage network VNWL turns out to be somewhat smaller in this case.

In the two alternative methods from FIGS. 5A and 5B, the two current paths via the transistors N1/P2 and the transistor N3 can therefore also be open in parallel, such that the word line WL is simultaneously discharged via the two voltage networks GND and VNWL until the potential of the first signal output 34 has fallen to $\text{Gnd}+V_t$ and $\text{Gnd}+V_t+V_{N1}$, respectively. The proportion of the current consumption which relieves the loading of the pumped voltage network VNWL is then dependent on the transistor parameters such as, for example, the threshold voltage and driver strength. Since the word line WL to be discharged represents a nonreactive resistance and additionally has a relatively high capacitance, the change in the electrical potential does not take place uniformly over the entire word line WL. Rather, a change in potential reaches that end of the word line WL which is remote from the local word line driver 4 only in a manner delayed by a time constant τ=RC, which is determined by the product of the nonreactive resistance R and the capacitance C of the word line WL. Consequently, the proportion of the current consumption which relieves the loading of the pumped voltage network VNWL is also dependent on the RC constant of the network to be discharged.

FIG. 5C illustrates the profile of the signals of the two alternative circuits from FIGS. 5A and 5B. After the signal at the node A0 has fallen from the "high" potential $V_{PP}$ to the "low" potential $V_{NWL}$, the transistors N1 and N3 open after a delay caused by the second inverter stage 32 and the charge-reversal operation of the word line WL begins. The electrical potential of the WLDV signal present at the first signal output 34 and also of the node A5 decreases as a result of this. Since the word line WL is discharged only via the pumped voltage network VNWL after the transistor P2 has turned off automatically, the WLDV signal has a somewhat flatter profile starting from this point in time. Therefore, the profile of the WLDV signal exhibits a slight bend in its middle part. While the electrical potential of the WLDV signal falls further down to the lower voltage level $V_{NWL}$ on account of the discharging operation via the pumped voltage network VNWL even after the transistor P2 has turned off, A5 remains essentially at the ground potential GND in the variant shown in FIG. 5A. By contrast, in the circuit variant shown in FIG. 5B, the potential of the node A5 likewise moves toward $V_{NWL}$ after the transistor P2 has turned off, as long as the transistor N1 is open.

Figure 6A:
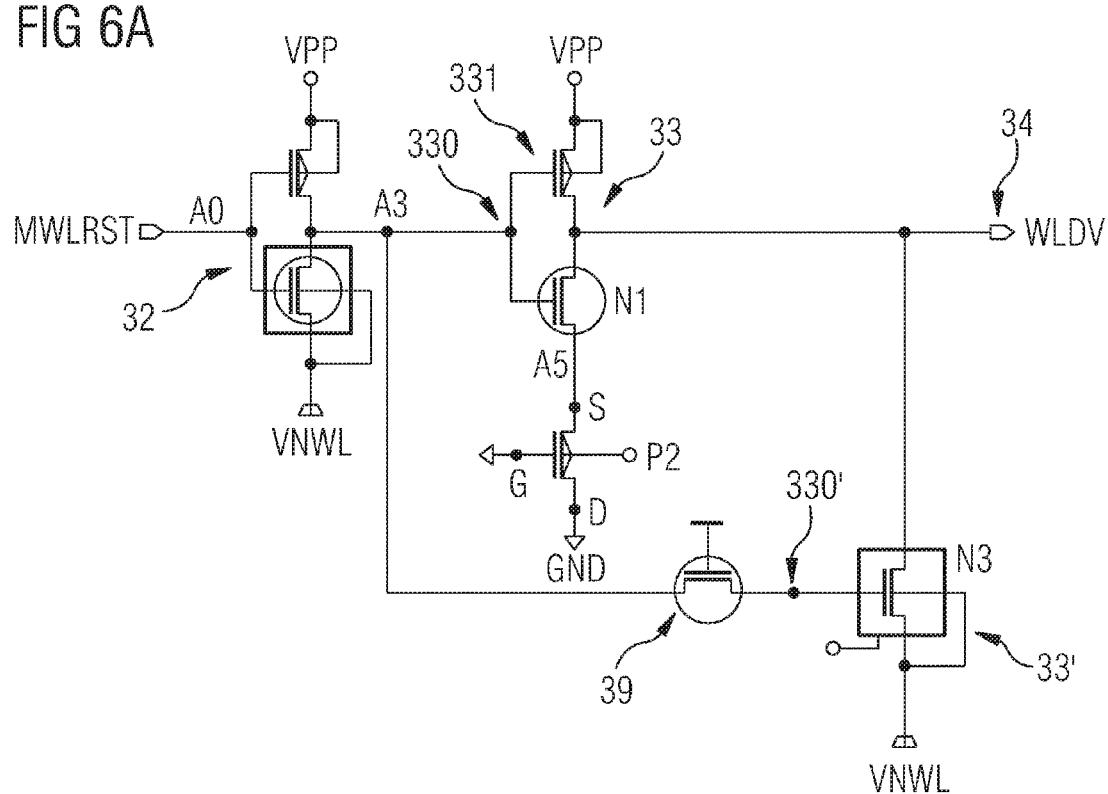
FIG. 6A shows one embodiment of a superordinate driver circuit in which the isolation of the circuit part from the second voltage network is effected in self-regulating and time-delayed fashion.

An additional decoupling of the two voltage networks GND and VNWL in the case of the two self-regulating variants can be achieved by the pumped voltage network NVWL additionally being connected in temporally delayed fashion. This can be effected e.g. by providing a delay stage in the signal path between the node A3 and the control input of the transistor N3. A corresponding delay can also be achieved by using signals of the circuit 3 that are already present. In the latter variant, e.g. the circuit parts already shown in FIGS. 3A and 4A can serve as the delay stage for the transistor N3. A corresponding delay can also be achieved by choosing a higher threshold voltage for the transistor N3 than for the transistor N1, such that the rising edge at the node A3 opens the transistor N1 first and the transistor N3 only afterward. Since, in this case, the delay is dependent on the gradient of the signal edge at the node A3 or at the gate terminal of the transistor N3, the connection behavior of the two voltage networks GND, VNWL can be varied by modifying said signal edge. Moreover, the edge can also be flattened by a delay transistor 39 arranged between the node A3 and the gate terminal of the transistor N3, said delay transistor 39 having a low saturation current. A modified upper signal path of the superordinate driver circuit 3 (FIG. 1A), which combines the automatic disconnection of the non-pumped voltage network GND and the delayed connection of the pumped voltage network VNWL with one another, is shown in FIG. 6A. The delay transistor 39 serving as a delay stage is for example driven with a reduced voltage $V_{INT}$, which is approximately 1 volt in the present example. The gate voltage of the delay transistor 39 determines how fast the signal edge propagates through the delay stage. The delay time can furthermore be determined by the strength of the series gate 39 and its form (length and width of the transistor). In principle, a corresponding delay can also be achieved by means of different components than the transistor 39.

Through the delayed connection of the pumped voltage network VNWL, an additional mutual decoupling of the two voltage networks GND, VNWL can be achieved occasionally. Apart from this, the proportion of the charge-reversal current drawn via the pumped voltage network VNWL can also be varied by means of the delayed connection of the pumped voltage network VNWL. In order to reduce the loading of the pumped voltage network VNWL as far as possible the charge-reversal current may be drawn exclusively via the non-external voltage network GND until the transistor P2 turns off automatically.

Figure 6B:
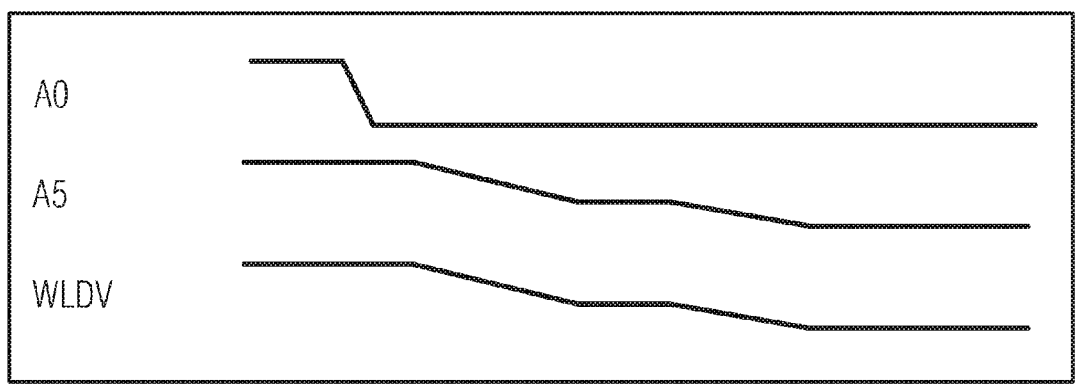
FIG. 6B shows a diagram for illustrating the temporal development of the signals of the superordinate driver circuit of FIG. 6A.
Figure 7A:
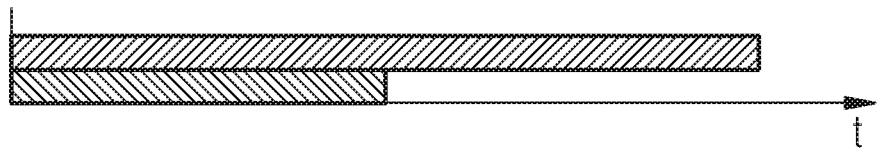
FIG. 7 shows five timing diagrams for illustrating different connection phases of the first and the second voltage network to the circuit part.
Figure 7B:
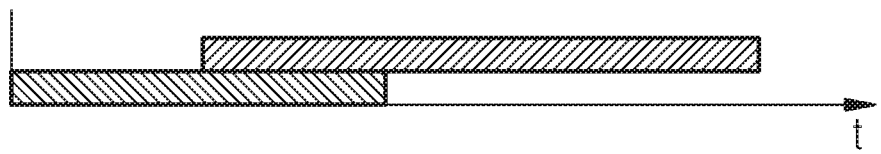
Figure 7C:
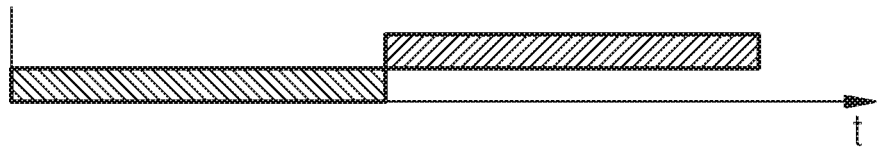
Figure 7D:
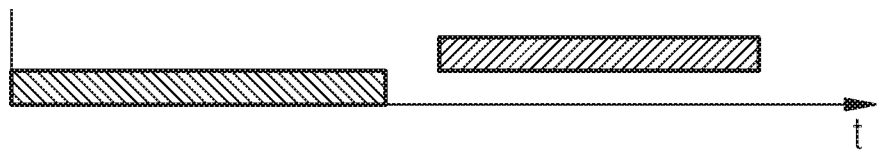
Figure 7E:
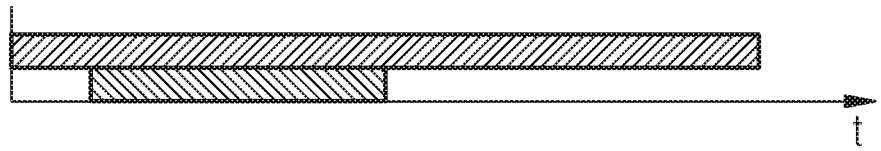

Finally, FIG. 6B schematically shows the profile of the signals of the superordinate driver circuit 4 from FIG. 6A. In this case, the signal profile essentially corresponds to that shown in FIG. 5C. However, since in the present case, on account of the gate 39 connected upstream, the transistor N3 connects the pumped voltage network VNWL only when the transistor P2 has already isolated the first signal output 34 from the non-pumped voltage network GND, the WLDV signal has a plateau in its middle region.

As a result of the self-regulating solution the undefined state (floating), which may occur in the case of the exclusively time-delayed variant, can be avoided. Said state arises if the ground voltage network GND has already been disconnected but the pumped voltage network VNWL has not yet been connected. Furthermore, this solution also permits a smaller layout area and also an increased reliability of the discharge transistors on account of the smaller current flow and the smaller voltage difference (less than $V_{PP}-V_{NWL}$).

FIG. 7 shows a total of five timing diagrams a) to e) illustrating different connection phases of the first and second voltage networks VNWL, GND during the charge-reversal operation of the word line WL. The first diagram a) in FIG. 7 shows the case in which both voltage networks VNWL and GND are simultaneously connected for charge reversal of the word line WL. In this case, the disconnection of the second voltage network GND can take place both in time-delayed fashion and in self-regulating fashion. This variant permits a particularly fast charge reversal of the word line since the charge-reversal current is drawn from both voltage networks VNWL and GND during the entire initial phase of the charge-reversal operation. On account of the relatively long connection phase of the pumped voltage network VNWL, however, this voltage network is also subjected to greater loading.

The second diagram b) in FIG. 7 shows the case in which the word line is firstly connected only to the second voltage network GND. Only after a temporal delay is the word line WL finally also connected to the first voltage network VNWL. This makes it possible to reduce the loading of the first voltage network VNWL in comparison with the variant shown in the first diagram a), since only the second voltage network GND is loaded in the initial phase of the charge-reversal operation. In this case, the isolation of the word line WL from the first voltage network VNWL can likewise take place both in time-delayed fashion and in self-regulating fashion. In the case of the first alternative, the delayed connection signal both of the first and of the second voltage network VNWL, GND can serve as the disconnection signal of the second voltage network GND.

The third diagram c) in FIG. 7 illustrates a particular variant of the charge reversal operation of the word line WL. In this case, the connection of the word line WL to the first voltage network VNWL takes place at the same point in time as the isolation of the word line WL from the second voltage network GND. Both the isolation from the second voltage network GND and the connection to the first voltage network VNWL can take place in time-delayed fashion, e.g. by delaying the connection signal of the second voltage network GND, or in self-regulating fashion. However, the isolation of the word line WL from the second voltage network GND can also be controlled directly by the connection signal of the first voltage network VNWL, and vice versa. With the aid of this embodiment variant, a particularly high relief of the loading of the pumped voltage network VNWL is possible since the charge-reversal current is drawn exclusively from the external voltage network GND during the entire first charge-reversal phase. Since the word line WL is connected to the first voltage network VNWL only when it is isolated from the second voltage network GND, a good decoupling of the two voltage networks VNWL, GND is possible. In the non-self-regulating case, this minimizes the risk of shunt currents flowing from the pumped voltage network VNWL to the external voltage network GND, or vice versa.

The fourth diagram d) in FIG. 7 shows a special case of the variant shown in the third diagram c) in FIG. 7. The decoupling of the two voltage networks VNWL, GND can be improved even further by a delay of the activation signal of the first voltage network VNWL relative to the disconnection signal of the second voltage network GND. This can be effected e.g. by virtue of the fact that the delayed disconnection signal or a correspondingly more lengthy delayed connection signal of the second voltage network GND serves as the connection signal of the first voltage network VNWL. The temporal decoupling of the connection phases of the two voltage networks VNWL, GND that is realized as a result of this ensures that shunt currents between the two networks VNWL, GND can be prevented even in the case where the word line WL, in the case shown in the third diagram c) in FIG. 7, has already been connected to the first voltage network VNWL but has not yet been fully decoupled from the second voltage network GND due to delay effects of the switching devices.

Finally, the fifth diagram e) in FIG. 7 shows a further possible variant, in which the charge-reversal current is predominantly drawn from the pumped voltage network VNWL. In this case, the second voltage network GND is connected only in delayed fashion and is disconnected again before the second voltage level $V_{NWL}$ has yet been reached. In this case, both the connection and the isolation of the word line WL from the second voltage network GND can take place in time-delayed or self-regulating fashion. By way of example, the correspondingly delayed activation signal of the first voltage network VNWL may serve as the activation signal for the second voltage network GND. By contrast, both the correspondingly more lengthily delayed activation signal of the first voltage network VNWL and the delayed activation signal of the second voltage network GND may serve as the deactivation signal for the second voltage network GND.

Figure 8:
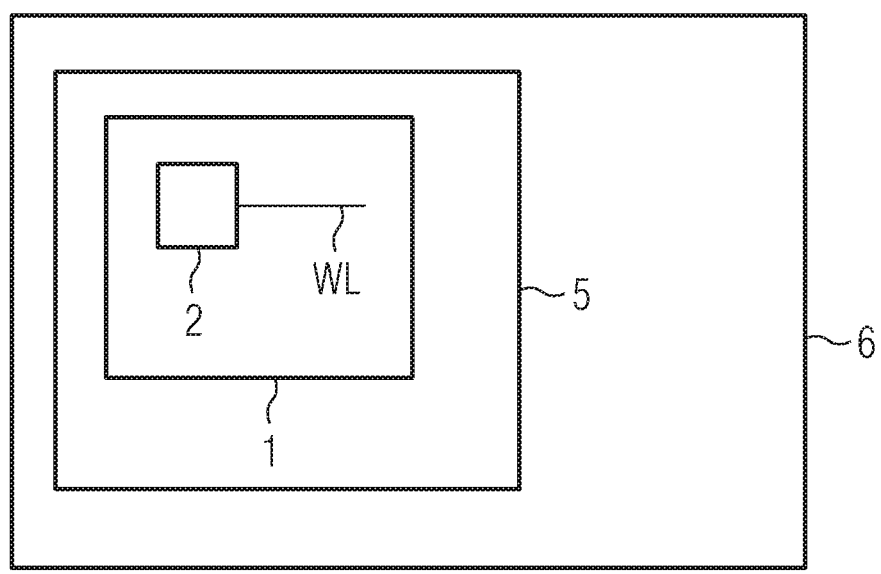
FIG. 8 shows one embodiment of an integrated memory circuit with a driver device as part of an electronic device.

Finally, FIG. 8 shows one embodiment of an integrated memory circuit 1 formed as part of an electronic device 6, such as e.g. of a computer, telephone, PDA or digital camera. The integrated memory circuit, which can be formed for example as a DRAM memory component 1 arranged on a memory module 5 of the electronic device 6, has at least one memory cell array with at least one of the driver devices 2 described above, to which at least one word line WL is connected.

It should be understood that the embodiments of the present invention may be formed as any number of different types of memory devices. In one embodiment, the memory may be a circuit included on a device with other types of circuits. For example, the memory may be integrated into a processor device, memory controller device, or other type of integrated circuit device. Devices into which the memory is integrated may include system-on-a-chip (SOC) devices. In another embodiment, the memory may be provided as a memory device which is used with a separate memory controller device or processor device.

In both situations, where the memory is integrated into a device with other circuits and where the memory is provided as a separate device, the memory may be used as part of a larger computer system. The computer system may include a motherboard, central processor, memory controller, the memory, a hard drive, graphics processor, peripherals, and any other devices which may be found in a computer system. The computer system may be part of a personal computer, a server computer, or a smaller system such as an embedded system, personal digital assistant (PDA), or mobile phone.

In some cases, a device including the memory may be packaged together with other devices. Such packages may include any other types of devices, including other devices with the same type of memory, other devices with different types of memory, and/or other devices including processors and/or memory controllers. Also, in some cases, the memory may be included in a device mounted on a memory module. The memory module may include other devices including memories, a buffer chip device, and/or a controller chip device. The memory module may also be included in a larger system such as the systems described above.

In some cases, embodiments of the invention may be used with multiple types of memory or with a memory which is included on a device with multiple other types of memory. The memory types may include volatile memory and nonvolatile memory. Volatile memories may include static random access memory (SRAM), pseudo-static random access memory (PSRAM), and dynamic random access memory (DRAM). DRAM types may include single data rate (SDR) DRAM, double data rate (DDR) DRAM, low power (LP) DDR DRAM, and any other types of DRAM. Nonvolatile memory types may include magnetic RAM (MRAM), flash memory, resistive RAM (RRAM), ferroelectric RAM (FeRAM), phase-change RAM (PRAM), electrically erasable programmable read-only memory (EEPROM), laser programmable fuses, electrically programmable fuses (e-fuses), and any other types of nonvolatile memory.

All the features disclosed in the description above, the drawings and the claims may be relevant to the invention both by themselves and in combination with one another. It is evident that all variations of the circuits disclosed here by way of example which are readily discernible to a person skilled in the art are concomitantly encompassed by the invention. This concerns, inter alia, those circuits in which circuit parts have been replaced by complementarily doped or equivalent circuit parts. It goes without saying that the circuit variants can also be applied to the charge reversal of the word lines from the negative $V_{NWL}$ potential to the $V_{PP}$ potential likewise provided by a pumped voltage network $V_{PP}$. Part of the charge-reversal current could then also be drawn from a non-pumped voltage network which provides for example the positive supply voltage $V_{ext}$ of the integrated circuit 1. A combination of the circuit for the stepwise discharging of the word line and the circuit for the stepwise charging of the word line is also possible within the superordinate driver circuit 3.

In the foregoing, reference is made to embodiments of the invention. However, it should be understood that the invention is not limited to specific described embodiments. Instead, any combination of the following features and elements, whether related to different embodiments or not, is contemplated to implement and practice the invention. Furthermore, in various embodiments the invention provides numerous advantages over the prior art. However, although embodiments of the invention may achieve advantages over other possible solutions and/or over the prior art, whether or not a particular advantage is achieved by a given embodiment is not limiting of the invention. Thus, the foregoing aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

Also, signal names used herein are exemplary names, indicative of signals used to perform various functions in a given memory device. In some cases, the relative signals may vary from device to device. Furthermore, the circuits and devices described herein and depicted in the figures are merely exemplary of embodiments of the invention. As recognized by those of ordinary skill in the art, embodiments of the invention may be utilized with any number of integrated circuits.

What is claimed is:

1. A method for charge reversal of a circuit part of an integrated circuit from a first to a second electrical potential, comprising:

connecting the circuit part to a first voltage network, which provides the second electrical potential;

connecting the circuit part to a second voltage network, which provides a third electrical potential between the first and the second electrical potential; and automatically isolating the circuit part from the second voltage network before the second electrical potential is reached;

whereby isolation of the circuit part from the second voltage network is performed by at least one of:

disconnecting the second voltage network from the circuit part using a delayed signal that is internal to the integrated circuit, and disconnecting the second voltage network from the circuit part based on the change of the circuit part from the first to the second electrical potential.

2. The method as claimed in claim 1, wherein the circuit part is firstly connected only to the second voltage network, and wherein the circuit part is isolated from the second voltage network before being connected to the first voltage network.

3. The method as claimed in claim 1, wherein the circuit part is firstly connected only to the second voltage network, and wherein the circuit part is connected to the first voltage network before being isolated from the second voltage network.

4. The method as claimed in claim 1, wherein the circuit part is simultaneously connected both to the first and to the second voltage network.

5. The method as claimed in claim 1, wherein the connection of the circuit part to the second voltage network is effected via a switching transistor, wherein the isolation of the circuit part from the second voltage network is effected automatically by virtue of a specific potential difference between two terminals of the switching transistor being undershot or exceeded due to the change in the electrical potential of the circuit part during charge reversal of the circuit part.

6. The method as claimed in claim 5, wherein the switching transistor automatically isolates the circuit part from the second voltage network as soon as the potential difference between a control terminal of the switching transistor and a current terminal of the switching transistor undershoots a threshold voltage of the switching transistor due to the change in the electrical potential of the circuit part during charge reversal of the circuit part, said threshold voltage forming the switching threshold between a conducting and a non-conducting operating state of the switching transistor and wherein the current terminal of the switching transistor is connected to the circuit part.

7. The method as claimed in claim 1, wherein the isolation of the circuit part from the second voltage network is effected via a first switching transistor as soon as a first control signal is present at a control input of the first switching transistor, and wherein the connection of the circuit part to the first voltage network is effected via a second switching transistor as soon as a second control signal, which is delayed relative to the first control signal, is present at a control input of the second switching transistor, wherein a signal of the integrated circuit is used as the second control signal.

8. The method as claimed in claim 7, wherein the second control signal is generated by delaying the first control signal.

9. The method as claimed in claim 1, wherein the second electrical potential of the first voltage network is provided by a charge pump generator of the integrated circuit, and/or wherein the third electrical potential of the second voltage network is provided by an external voltage supply of the integrated circuit.

10. An integrated circuit, comprising:

a circuit part having a first operating state determined by a first electrical potential, and a second operating state determined by a second electrical potential, wherein the circuit part is subjectable to charge reversal between the first and the second electrical potential;

a first voltage network, which provides the second electrical potential;

a second voltage network, which provides a third electrical potential between the first and the second electrical potential; and a driver device, which brings about a charge reversal of the circuit part from the first to the second electrical potential;

wherein the driver device comprises a first switching device, which is arranged between the circuit part and the first voltage network and via which the circuit part is connectable to the first voltage network for the purpose of charge reversal, wherein the driver device comprises a second switching device arranged between the circuit part and the second voltage network and via which the circuit part is connectable to the second voltage network for the purpose of charge reversal, and wherein the driver device is configured to automatically isolate the circuit part from the second voltage network before the second electrical potential is reached, wherein the driver device is configured to isolate the circuit part from the second voltage network by at least one of:
 disconnecting the second voltage network from the circuit part using a delayed signal that is internal to the integrated circuit, and
 disconnecting the second voltage network from the circuit part based on the change of the circuit part from the first to the second electrical potential.

11. The integrated circuit as claimed in claim 10, wherein the first switching device has a first control input, which is connected to a first control line, wherein the first switching device is configured to connect the circuit part to the first voltage network as soon as the first control input receives a control signal via the first control line, and wherein the second switching device has a second control input, which is connected to the first control line via a signal delay device, wherein the second switching device is configured to isolate the circuit part from the second voltage network when the second control input receives the control signal delayed by the signal delay device.

12. The integrated circuit as claimed in claim 11, wherein the signal delay device comprises an inverter stage, a level shifter or a transistor of the integrated circuit.

13. The integrated circuit as claimed in claim 11, wherein the signal delay device is part of a further signal path of the integrated circuit.

14. The integrated circuit as claimed in claim 10, wherein the first switching device has a switching transistor, which isolates the circuit part from the second voltage network, wherein the switching transistor is configured to isolate the circuit part from the second voltage network if a specific potential different between two terminals of the switching transistor is undershot or exceeded due to the change in the electrical potential of the circuit part during charge reversal of the circuit part.

15. The integrated circuit as claimed in claim 14, wherein the switching transistor has a gate terminal connected to the second voltage network, a drain terminal connected to the second voltage network, and a source terminal connected to the circuit part, wherein the switching transistor is configured to automatically isolate the circuit part from the first voltage network when the potential difference between its gate terminal and its source terminal undershoots or exceeds a threshold voltage of the switching transistor due to the change in the electrical potential of the circuit part during charge reversal of the circuit part, said threshold voltage forming the switching threshold between a conducting and a non-conducting operating state of the switching transistor.

16. The integrated circuit as claimed in claim 10, wherein the integrated circuit is formed as a memory device comprising a circuit part formed as a word line and a driver device formed as a word line driver, wherein the word line driver is configured to subject the word line to charge reversal between an active and an inactive operating state.

17. The integrated circuit as claimed in claim 16, wherein the second switching device is controlled via a delay device that is part of a signal path provided for generating a word line restore signal WLRST.

18. The integrated circuit as claimed in claim 10, wherein the first voltage network is connected to a charge pump generator of the integrated circuit, and/or wherein the second voltage network is connected to an external voltage supply of the integrated circuit.

19. An electronic device comprising an integrated circuit, the integrated circuit comprising:

a circuit part having a first operating state, which is determined by a first electrical potential, and a second operating state, which is determined by a second electrical potential, wherein the circuit part is subjectable to charge reversal between the first and the second electrical potential;

a first voltage network, which provides the second electrical potential;

a second voltage network, which provides a third electrical potential lying between the first and the second electrical potential; and a driver device, which brings about a charge reversal of the circuit part from the first to the second electrical potential, wherein the driver device comprises a first switching device arranged between the circuit part and the first voltage network and via which the circuit part can be connected to the first voltage network for the purpose of charge reversal, wherein the driver device comprises a second switching device arranged between the circuit part and the second voltage network and which via the circuit part can be connected to the second voltage network for the purpose of charge reversal, and wherein the driver device is configured to automatically isolate the circuit part from the second voltage network before the second electrical potential is reached, wherein the driver device is configured to isolate the circuit part from the second voltage network by at least one of:

disconnecting the second voltage network from the circuit part using a delayed signal that is internal to the driver device, and disconnecting the second voltage network from the circuit part based on the change of the circuit part from the first to the second electrical potential.

\* \* \* \* \*